(12) United States Patent
Nozawa et al.

(10) Patent No.: US 6,395,434 B1
(45) Date of Patent: *May 28, 2002

(54) PHASE SHIFT MASK AND PHASE SHIFT MASK BLANK

(75) Inventors: Osamu Nozawa, Fuchu; Hideaki Mitsui, Tachikawa; Megumi Takeuchi, Akishima, all of (JP)

(73) Assignee: Hoya Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/591,120

(22) Filed: Jun. 9, 2000

(30) Foreign Application Priority Data

Jun. 11, 1999 (JP) .............................................. 11-165902

(51) Int. Cl.⁷ .............................. G03F 9/00; B32B 15/00
(52) U.S. Cl. .......................................... 430/5; 428/432
(58) Field of Search ...................... 430/5, 322; 428/426, 428/428, 432

(56) References Cited

U.S. PATENT DOCUMENTS 6,087,047 A * 7/2000 Mitsui et al. .................. 430/5

* cited by examiner

Primary Examiner—S. Rosasco
(74) Attorney, Agent, or Firm—Cook, Alex, McFarron, Manzo, Cummings & Mehler, Ltd.

(57) ABSTRACT

There is disclosed a halftone phase shift mask blank, in which, for example, a semitransparent film (halftone phase shifter film) 2 contains silicon, palladium, and at least one selected from nitrogen, oxygen and hydrogen, and silicon and palladium contained in the semitransparent film are in a relation represented by the following equation:

[atom % of palladium in the film]/[(atom % of palladium in the film)+(atom % of silicon in the film)]×100=10 to 40(%).

34 Claims, 3 Drawing Sheets

FIG. 7

| Film Composition | Example 1 | Example 2 | Example 3 | Example 4 | Comparative example 1 | Comparative example 2 | Comparative example 3 | Comparative example 4 | Comparative example 5 |
|---|---|---|---|---|---|---|---|---|---|
|  | PdSiN | PdSiON | PdVSiN | PdVSiON | SiN | SiN | PdSiN | PdSiON | PdVSiN |
| Si (atom %) | 45 | 37 | 41 | 37 |  |  | 42 | 36 | 39 |
| Pd (atom %) | 11 | 9 | 4 | 4 |  |  | 2 | 35 | 2 |
| V (atom %) | 0 | 0 | 10 | 9 |  |  | 0 | 0 | 27 |
| N (atom %) | 43 | 15 | 44 | 12 |  |  | 56 | 9 | 33 |
| O (atom %) | 0 | 37 | 0 | 38 |  |  | 0 | 20 | 0 |
| H (atom %) | 0 | 0 | 0 | 0 |  |  | 0 | 0 | 0 |
| Si+Pd total amount (atom %) | 56 | 46 | 45 | 41 |  |  | 44 | 71 | 39 |
| Pd/(Si+Pd) (%) | 19 | 19 | 8 | 8 |  |  | 4.5 | 49 | 4.9 |
| Transmittance (%) (at193nm) | 3.5 | 9.1 | 4.1 | 6.0 | 14.3 | 1.89 | 11 | 0 | 1.0 |
| Transmittance (%) (at364nm) | 28.1 | 36.2 | 36.1 | 39.8 | 76.6 | 62.3 | 68 | 49 | 49 |
| Target | Si,Pd | Si,Pd | Si,Pd,V | Si,Pd,V | Si | Si | Si,Pd | Si,Pd | Si,Pd,V |
| Pd/(Si+Pd) in target (%) | 20 | 20 | 8 | 8 |  |  | 7.7 | 49 | 4.9 |
| Sputter gas | Ar:N₂ 1:4 | Ar:N₂:O₂ 10:37:3 | Ar:N₂ 1:4 | Ar:N₂:O₂ 10:38:2 | Ar:N₂ 1:4 | Ar:N₂ 4:1 | Ar:N₂ 1:4 | Ar:N₂:O₂ 5:5:1 | Ar:N₂ 1:3 |
| Etching gas | Cl₂ | Cl₂ | Cl₂ | Cl₂ | Cl₂ | Cl₂ | Cl₂ | Cl₂ | Cl₂ |

PHASE SHIFT MASK AND PHASE SHIFT MASK BLANK

REFERENCE TO RELATED APPLICATION

This application claims the priority right under Paris Convention of Japanese Patent Application No. Hei 11-165902 filed on Jun. 11, 1999, the entire disclosure of which is incorporated herein by reference.

BACKGROUND OF THE INVENTION

1. Field of the Invention

The present invention relates to a phase shift mask for use in performing exposure, and transfer on a fine pattern and a phase shift mask blank as the mother material of the mask, particularly to a halftone phase shift mask and a phase shift mask blank.

2. Description of the Related-Art

For the high integration of DRAM starting with 1 Mbit, in these days, the mass production system of 64 Mbit. 256 Mbit DRAM has been established. In this technical innovation, an exposure light source has been shortened in wavelength from g ray (436 nm) to i ray (365 nm) of an ultrahigh pressure mercury lamp. Still at present, the reduction of the exposure wavelength has been studied aiming at higher integration. However, in the usual photolithography method, when the exposure wavelength is shortened, the resolution is improved, but the focus depth is decreased. This causes a problem that the burden on the design of the optical exposure system is increased, the process stability is remarkably deteriorated and that the product yield is adversely affected.

A phase shift method is one of ultra-resolution pattern transfer methods effective for the problem. In the phase shift method, a phase shift mask is used as a mask for transferring a fine pattern.

The phase shift mask is constituted, for example, of a phase shifter part forming a pattern part on the mask, and a non-pattern part (substrate exposure part) in which no phase shifter is present. By shifting the phase of a light transmitted through both part by about 180°, mutual light interference is caused in a pattern boundary part, and this enhances the contrast of a transferred image. Furthermore, by using the phase shift method, the focus depth can be increased to obtain a necessary resolution. As compared with a transfer process using the ordinary mask provided with a usual light screen pattern of a chromium film, and the like, even when the same wavelength light is used, the resolution can be improved and additionally the process applicability can be enlarged.

The phase shift mask is roughly classified into a complete transmission type (Shibuya/Levenson type) phase shift mask and a halftone phase shift mask for practical use in accordance with the light transmission properties of the phase shifter part. In the former, the transmittance of the phase shifter part is equal to that of the non-pattern part (substrate exposure part), the mask is substantially transparent to the exposure wavelength, and it is said that the mask is generally effective for a line and space transfer. On the other hand, for the latter, the transmittance of the phase shifter part is of the order of several percentages to several tens of percentages of that of the non-pattern part (substrate exposure part), and it is said that the mask is effective for forming a contact hole or an isolated pattern in a semiconductor manufacture process.

FIG. 1 shows the basic structure of a halftone phase shift mask blank, and FIG. 2. shows the basic structure of a halftone phase shift mask. Additionally, the description of a reflection preventive layer, an etching stop layer, and the like for use in the lithography process is omitted.

The halftone phase shift mask blank is constituted by forming a semitransparent film (halftone phase shifter film) 2 on a transparent substrate 1. Moreover, the halftone phase shift mask is constituted of a phase shifter part 3 forming a pattern part on the mask, and a non-pattern part (substrate exposure part) 4 in which no phase shifter is present. Here, the phase shifter part 3 shifts the phase of the exposure light transmitted in the vicinity of an edge to fulfill the function as the phase shifter, and performs a light screen function for substantially intercepting the exposure light with respect to a resist on a transfer substrate.

The halftone phase shift mask includes a single-layer halftone phase shift mask which is simplified in structure and which is easily manufactured. Examples of the single-layer halftone phase shift mask include: a mask comprising a phase shifter formed of chromium-based materials such as $CrO_x$, $CrN$, $CrO_xN_y$, $Cr_xON_yC_z$ as described in Japanese Patent Application Laid-Open No. 127361/1993; a mask comprising a phase shifter formed of MoSi-based materials such as MoSiO and MoSiOn as described in Japanese Patent Application Laid-Open No. 332152/1994; and a mask comprising a phase shifter formed of SiN or SiO-based materials as described in Japanese Patent Application Laid-Open No. 261370/1995.

In recent years, with the shortening of the exposure wavelength, the halftone phase shift mask has been increasingly used, and a krypton fluoride (KrF) excimer laser light (248 nm) has been used as a light shorter in wavelength than the i ray. Moreover, the use of an argon fluoride (ArF) excimer laser light (193 rnm) or a fluorine dimer ($F_2$) excimer laser light (157 nm) as a shorter wavelength light is also proposed.

With the shortening of the exposure wavelength, in the corresponding phase shift mask and phase shift mask blank, the control of transmittance, refractive index and other optical coefficients in the exposure wavelength for use becomes important. Different from visible to near ultraviolet areas, in the area with the wavelength shorter than 250 nm, since the degree of light absorption remarkably increases in many substances, it is difficult to control and obtain a desired transmittance. Therefore, the halftone phase shift mask for the i ray cannot usually be used as it is, as the halftone phase shift mask for the exposure light shorter than 250 nm. The transmittance in the halftone phase shifter is set depending on the sensitivity of the resist for use in the pattern transfer and the patterning process but, for example, in the halftone phase shift mask, it is preferable to control the transmittance of the exposure light in a range of 3% to 20% in the film thickness of the phase shifter for shifting the phase of the exposure light by a predetermined angle.

Moreover, even if the basic prescribed properties such as the transmittance and refractive index in the exposure wavelength are satisfied with the shortening of the exposure wavelength, no test can be performed with a high transmittance for the wavelength of test light (e.g., 364 nm, 488 nm, 633 nm), which is not suitable for practical use. Therefore, for the practical use, the transmittance is requested to be controlled to a desired value with respect to the wavelength of the test light.

Furthermore, in addition to the above-described properties, the halftone phase shift mask and the halftone phase shift mask blank as the mother material for forming the mask are requested to be stable against excimer laser irradiation for use (light-resistant), chemically durable in a cleaning process essential for the mask process (chemical-resistant) and to minimize micro defects in the blank which remarkably deteriorate the mask quality (low defect density).

Specifically, the shortening of the exposure wavelength also means that the density of the energy radiated per unit time increases. To cope with this, the film material for forming a phase shifter layer is requested not to deteriorate the function as the phase shift mask by damages caused by the high-energy irradiation. Here, the damages mean the change in optical properties (refractive index, transmittance, and the like) of the shifter film and the generation of color defects by the irradiation, film thickness changes, film quality deterioration, and the like. For example, when the excimer laser with the wavelength in a deep ultraviolet area is radiated, in-film substances are excited by a double photon process, this is said to cause changes in film optical properties and film quality, but details are not clarified. In any case, it is one of indispensable conditions that the phase shifter film is provided with a high resistance to irradiation in the high-energy irradiation with the shortening of the exposure wavelength.

Moreover, when the material of the shifter film is considered from the viewpoint of the mask material, the film must not be changed in properties or dissolved by cleaning by acids and alkalis in the mask forming process. Specifically, the phase shifter film requires the chemical resistance regardless of the size of the exposure wavelength.

Furthermore, considering that the phase shift mask is a tool for performing a fine processing, a fine processability is necessary so that the processing (patterning, etching, and the like) of the phase shift mask blank can be achieved with a high precision, and it is therefore requested that the phase shifter film be homogeneous and no defect be found in the film. It is said that the miniaturization of the mask pattern will further advance with the shortening of the exposure wavelength, and the defect in the phase shifter film raises an important problem which influences the reliability of the pattern transfer.

However, in the conventional halftone phase shift mask and blank, the basic prescribed properties such as the transmittance and refractive index with the shortening of the exposure wavelength, and all other above-described prescribed properties are not sufficiently achieved.

SUMMARY OF THE INVENTION

The present invention has been developed under the above-described background, and an object thereof is to provide a superior halftone phase shift mask for coping with a shortened exposure wavelength and the blank of the mask.

To achieve the aforementioned object, there are provided the following structures according to the present invention.

(Structure 1) A halftone phase shift mask blank for forming a phase shift mask, constituted by forming, on a transparent substrate, a semitransparent film provided with a function of producing a predetermined amount of phase difference in a light transmitted through the semitransparent film with respect to a light transmitted directly through the transparent substrate and a function of attenuating light intensity, in which the semitransparent film contains silicon, palladium, and at least one selected from nitrogen, oxygen and hydrogen.

(Structure 2) The halftone phase shift mask blank according to the structure 1 in which the total amount of silicon and palladium in the semitransparent film is in a range of 30 to 67 atom %.

(Structure 3) The halftone phase shift mask blank according to the structure 2 in which silicon and palladium contained in the semitransparent film are in a relation represented by the following equation (I):

[atom % of palladium in the film]/[(atom % of palladium in the film)+(atom % of silicon in the film)]×100=10 to 40(%)   Equation (I).

(Structure 4) The halftone phase shift mask blank according to any one of the structures 1 to 3 in which at least one selected from nitrogen, oxygen and hydrogen contained In the semitransparent film forms a chemical bond to silicon.

(Structure 5) The halftone phase shift mask blank according to any one of the structures 1 to 4 in which the semitransparent film contains silicon, palladium, and nitrogen.

(Structure 6) The halftone phase shift mask blank according to the structure 5 in which the content of nitrogen in the semitransparent film is more than 0 and not more than 60 atom %.

(Structure 7) The halftone phase shift mask blank according to the structure 6 in which the content of nitrogen in the semitransparent film is more than 0 and not more than 50 atom %.

(Structure 8) The halftone phase shift mask blank according to any one of the structures 1 to 7 in which the semitransparent film contains oxygen in a range of 0 to 65 atom %.

(Structure 9) The halftone phase shift mask blank according to the structure 8 in which the semitransparent film contains oxygen in a range of 3 to 50 atom %.

(Structure 10) A halftone phase shift mask blank for forming a phase shift mask, constituted by forming, on a transparent substrate, a semitransparent film provided with a function of producing a predetermined amount of phase difference in a light transmitted through the semitransparent film with respect to a light transmitted directly through the transparent substrate and a function of attenuating light intensity, in which the semitransparent film contains at least one element M selected from metals and transition metals (M denotes the metal or the transition metal other than palladium), silicon, palladium, and at least one selected from nitrogen, oxygen and hydrogen.

(Structure 11) The halftone phase shift mask blank according to the structure 10 in which the total amount of silicon and palladium in the semitransparent film is in a range of 30 to 67 atom %.

(Structure 12) The halftone phase shift mask blank according to the structure 10 or 11 in which said semitransparent film contains at least one element M selected from the metals and transition metals by more than 0 and not more than 20 atom %.

(Structure 13) The halftone phase shift mask blank according to the structure 12 in which silicon and palladium contained in the semitransparent film are in a relation represented by the following equation (II):

[atom % of palladium in the film]/[(atom % of palladium in the film)+(atom % of silicon in the film)]×100=5 to 40(%)   Equation (II).

(Structure 14) The halftone phase shift mask blank according to any one of the structures 10 to 13 in which at least one selected from nitrogen, oxygen and hydrogen contained in the semitransparent film forms a chemical bond to silicon.

(Structure 15) The halftone phase shift mask blank according to any one of the structures 10 to 14 in which at least one element M selected from the metals or transition metals comprises at least one element selected from the group consisting of cobalt, tantalum, tungsten, molybdenum, chromium, vanadium, titanium, niobium, zinc, zirconium, hafnium, germanium, aluminum, platinum, manganese, and iron.

(Structure 16) The halftone phase shift mask blank according to any one of the structures 10 to 15 in which the semitransparent film contains at least one element M selected from the metals and transition metals, silicon, palladium, and nitrogen.

(Structure 17) The halftone phase shift mask blank according to the structure 16 in which the content of nitrogen in the semitransparent film is more than 0 and not more than 60 atom %.

(Structure 18) The halftone phase shift mask blank according to the structure 17 in which the content of nitrogen in the semitransparent film is more than 0 and not more than 50 atom %.

(Structure 19) The halftone phase shift mask blank according to any one of the structures 10 to 18 in which the semitransparent film contains oxygen in a range of 0 to 65 atom %.

(Structure 20) The halftone phase shift mask blank according to the structure 19 in which the semitransparent film contains oxygen in a range of 3 to 50 atom %.

(Structure 21) The halftone phase shift mask blank according to any one of the structures 1 to 20 in which the semitransparent film has a transmittance of 40% or less with respect to a desired test light in a test light wave range of 190 nm to 650 nm of the phase shift mask blank and phase shift mask.

(Structure 22) A method of manufacturing a halftone phase shift mask blank, comprising the steps of: using a sputtering target and a gas containing the constituting elements of the semitransparent film according to any one of the structures 1 to 21 and forming a semitransparent film on a transparent substrate by a sputtering method.

(Structure 23) The method of manufacturing the halftone phase shift mask blank according to the structure 22 in which the sputtering target contains silicon and palladium.

(Structure 24) The method of manufacturing the halftone phase shift mask blank according to the structure 23 in which silicon and palladium contained in the sputtering target are in a relation represented by the following equation (III):

$$[\text{atom \% of palladium}]/[(\text{atom \% of palladium})+(\text{atom \% of silicon})]100 = 5 \text{ to } 40(\%) \quad \text{Equation (III)}.$$

(Structure 25) A method of manufacturing a halftone phase shift mask, comprising the steps of: subjecting the semitransparent film in the halftone phase shift mask blank according to any one of the structures 1 to 21 to an etching processing in dry etching using a chlorine containing gas and/or a fluorine containing gas.

(Structure 26) A halftone phase shift mask in which the halftone phase shift mask blank according to any one of the structures 1 to 21 is used, and a semitransparent mask pattern to be transferred to a wafer is formed on a transparent substrate.

(Structure 27) The halftone phase shift mask according to the structure 26 which is provided with a transmittance of 3% to 20% with respect to a desired exposure light in a wave range of 150 nm to 370 nm and which is subjected to an optical design to function as the phase shift mask.

(Structure 28) A pattern transfer method, comprising the steps of: using the halftone phase shift mask according to the structure 26 or 27 to perform a pattern transfer.

(Structure 29) A semiconductor device which is formed by using the halftone phase shift mask according to the structure 26 or 27 and performing the pattern transfer.

The basic condition of the present invention is that the use is possible with respect to the ultraviolet to deep ultraviolet exposure wave range. Therefore, the phase shifter film has to be provided with optical translucency with respect to the desired exposure wavelengths such as the oscillation wavelength of krypton fluoride excimer laser of 248 nm and the oscillation wavelength of argon fluoride excimer laser of 193 nm or other wavelengths, and this optical translucency has to be controllable in the film formation. Moreover, in addition to the optical translucency, the optical refractive index is necessary, and this optical refractive index has to be controllable similarly as the optical translucency. The refractive index is correlated with the film thickness of the phase shifter, and determines the phase shift angle as the important requirement of the phase shift mask. For example, when the refractive index is 2, the film thickness at which the phase shift angle of 180° is obtained is 124 nm (×N: natural number) with the wavelength of 248 nm, and similarly 96.5 nm (×N: natural number) with the wavelength of 193 nm. Therefore, the desired optical translucency is actually required on the assumption that the film thickness condition for achieving the set phase shift angle is satisfied, and it is very important that these numeric values be controllable.

On the other hand, particularly in the present invention, by containing palladium and selecting and controlling the film composition (the constituting elements and the ratio) and film qualities (including the bond state and film structure), the semitransparent film can be obtained which satisfies the basic prescribed properties such as the transmittance and refractive index with respect to the exposure wavelength and which is additionally provided with the desired transmittance with respect to the desired test light in the test light wave range of 190 nm to 650 nm.

According to the above-described structure 1, when the semitransparent film contains silicon, palladium, and at least one selected from nitrogen, oxygen and hydrogen, all the prescribed properties of the halftone phase shift mask can be satisfied. Specifically, the semitransparent film of the structure 1 can satisfy the basic prescribed properties such as the transmittance and refractive index with respect to the exposure wavelength, and satisfy all other prescribed properties such as the transmittance with respect to the test light wavelength, optical resistance, chemical durability (resistance to chemicals) and low defect density.

According to the above-described structure 2, when the total amount of silicon and palladium in the semitransparent film is less than 30 atom %, the transmittance in the test light wave range is too high and it possibly becomes difficult to test the film. When the total amount of silicon and palladium in the semitransparent film exceeds 67 atom %, the transmittance in the exposure wave range is possibly deteriorated. From the similar viewpoint, the total amount of silicon and palladium in the semitransparent film is preferably in a range of 40 to 60 atom %.

Additionally, the content of silicon in the semitransparent film is preferably of the order of 30 to 55 atom %, more preferably 35 to 50 atom %. When the content of silicon is in this area, the strength of the semitransparent film is kept to be stable, and the film provided with the transmittance suitable for the exposure light is easily formed.

Moreover, the content of palladium in the semitransparent film is preferably of the order of 3 to 20 atom %, more preferably 4 to 15 atom %. When the content of palladium is in this range, particularly the required optical properties of the semitransparent film such as the transmittance and refractive index with respect to the light of the exposure wave range can easily be obtained, and the film provided with the transmittance suitable for the test light can easily be obtained. Furthermore, it is easy to form the semitransparent film also superior in the electric properties, chemical durability, and the like.

According to the above-described structure 3, when silicon and palladium contained in the semitransparent film are in a relation represented by the equation (I), the semitransparent film can easily satisfy all the prescribed properties of the halftone phase shift mask.

Additionally, when the ratio of [atom % of palladium in the film] to [atom % of palladium in the film+atom % of silicon in the film] is less than 10%, the transmittance rises in the entire wave range. On the other hand, the transmittance in the test light wave range is 40% or more, and it is substantially difficult to test the film. When the ratio exceeds 40%, the transmittance in the entire wave range, particularly in the vicinity of the exposure wavelength is lowered and the function as the halftone phase shifter is deteriorated. When the ratio of silicon to palladium is set in the above-described range, and at least one selected from nitrogen, oxygen and hydrogen is contained, the properties such as the transmittance and refractive index can be controlled.

According to the above-described structure 4, the semitransparent film satisfying the requirements of the above-described structures 1 to 3 preferably comprises an amorphous structure film containing an Si—N bond, Si—O bond, Si—H bond in order to control and improve the prescribed properties.

According to the above-described structure 5, when particularly nitrogen is contained as an essential component, it becomes easy to control the transmittance and refractive index of the semitransparent film and obtain the desired values.

According to the above-described structure 6, when the content of nitrogen in the semitransparent film exceeds 60 atom %, the transmittance rises in the entire wave range and it becomes difficult to perform the test. Furthermore, the film resistivity rises, and troubles such as film charge-up are brought about during the electron line drawing of the blank.

In the above-described structure 7, from the viewpoint similar to that of the above-described structure 6, the preferred content of nitrogen in the semitransparent film is further defined.

According to the above-described structure 8, when the content of oxygen in the semitransparent film exceeds 65 atom %, the transmittance rises in the entire wave range and the test becomes difficult to perform. Additionally, the film resistivity rises, the film refractive index is lowered, and the required electric and optical properties are not satisfied.

In the above-described structure 9, from the viewpoint similar to that of the structure 8, the preferred content of oxygen in the semitransparent film is further defined. Additionally, the content of oxygen is set to 3 atom % or more. When the content of oxygen is less than 3 atom %, the effect by oxygen of controlling the optical absorbency properties and optical transmission properties with good balance to obtain the desired semitransparent film cannot sufficiently be obtained.

According to the above-described structure 10, when the semitransparent film is constituted mainly of four or more elements including the metal and/or the transition metal M, silicon, palladium and at least one selected from nitrogen, oxygen and hydrogen, all the prescribed properties of the halftone phase shift mask can be satisfied.

Moreover, in the structure 10, by adding the metal and/or the transition metal, the prescribed properties can easily be controlled and improved.

In the above-described structure 11, when the total amount of silicon and palladium in the semitransparent film is less than 30 atom %, the transmittance in the test light wave range is too high and the film test possibly becomes difficult to perform. When the total amount of silicon and palladium in the semitransparent film exceeds 67 atom %, the transmittance in the exposure wave range is possibly deteriorated. From the similar viewpoint, the total amount of silicon and palladium in the semitransparent film is preferably in a range of 40 to 60 atom %.

Additionally, the content of silicon in the semitransparent film is preferably in a range of 30 to 55 atom %, more preferably 35 to 50 atom %. When the content of silicon is in this range, the strength of the semitransparent film is kept to be stable, and the film provided with the transmittance suitable for the exposure light is easily obtained.

Moreover, the content of palladium in the semitransparent film is preferably of the order of 3 to 20 atom %, more preferably 4 to 15 atom %. When the content of palladium is in this range, it is possible to easily obtain particularly the required optical properties of the semitransparent film such as the transmittance and refractive index with respect to the light of the exposure wave range, and the film provided with the transmittance suitable for the test light. Furthermore, it is easy to form the semitransparent film also superior in the electric properties, chemical durability, and the like.

In the above-described structure 12, when the content of the metal or the transition metal (element M) other than palladium exceeds 20 atoms %, the transmittance in the exposure wave range is possibly deteriorated.

Additionally, the total amount of silicon, palladium and element M in the semitransparent film is preferably in a range of 30 to 67 atom %. When the total amount is in this range, the required optical properties and chemical durability of the semitransparent film can easily be controlled, and the semitransparent film provided with the desired properties can easily be formed.

According to the above-described structure 13, when the semitransparent film contains the metal and/or the transition metal M, silicon, palladium, and at least one selected from nitrogen, oxygen and hydrogen, and the ratio of silicon and palladium contained in the semitransparent film is specified, all the prescribed properties of the halftone phase shift mask can be satisfied.

Additionally, when the ratio of [atom % of palladium in the film] to [atom % of palladium in the film+atom % of silicon in the film] is less than 5%, the transmission rises in the entire wave range. On the other hand, the transmittance in the test light wave range is 40% or more, and it is substantially difficult to test the film. When the ratio exceeds 40%, the transmittance in the entire wave range, particularly in the vicinity of the exposure wavelength is lowered and the function as the halftone phase shifter is deteriorated.

According to the above-described structure 14, the semitransparent film satisfying the requirements according to any one of the above-described structures 10 to 13 preferably comprises the amorphous structure film containing the Si—N bond, Si—O bond, Si—H bond in order to control and improve the prescribed properties.

According to the above-described structure 15, when these elements are used as the metals and/or the transition metals M, the desired optical properties can be achieved, and additionally the film electric properties, optical properties and chemical durability are effectively enhanced.

Specifically, it is possible to achieve the enhancement of the film conductivity as the improvement of the electric properties, the transmittance control in the exposure wavelength and the improvement of the transmittance in the test light wave range as the improvement of the optical properties, and the improvement of the durability against acids and alkalis used in the mask cleaning process as the improvement of the chemical durability.

Additionally, among these elements, vanadium (V) is preferably contained. When vanadium is contained, the etching selection ratio of the semitransparent film with respect to the transparent substrate formed of quartz can further be enhanced.

According to the above-described structure 16, when particularly nitrogen is contained as the essential component, the transmittance and refractive index of the semitransparent film can easily be controlled to obtain the desired values.

According to the above-described structure 17, when the content of nitrogen in the semitransparent film exceeds 60 atom %, the transmittance rises in the entire wave range and the test becomes difficult to perform. Furthermore, the film resistivity rises, and the troubles such as film charge-up are brought about during the electron line drawing of the blank.

In the above-described structure 18, from the viewpoint similar to that of the structure 17, the preferred content of nitrogen in the semitransparent film is further defined.

According to the above-described structure 19, when the content of oxygen in the semitransparent film exceeds 65 atom %, the transmittance rises in the entire wave range and the test becomes difficult to perform. Additionally, the film resistivity rises, the film refractive index is lowered, and the required electric and optical properties are not satisfied.

In the above-described structure 20, from the viewpoint similar to that of the structure 19, the preferred content of oxygen in the semitransparent film is further defined. Additionally, the content of oxygen is set to 3 atom % or more. When the content of oxygen is less than 3 atom %, it is impossible to sufficiently obtain the effect by oxygen of controlling the optical absorbency properties and optical transmission properties with good balance to obtain the desired semitransparent film.

According to the above-described structure 21, when the film composition (the constituting elements and ratio) and film quality (including the bond state and film structure are selected and controlled in the above-described structures 1 to 20, the semitransparent film provided with the transmittance of 40% or less with respect to the desired test light in the test light wave range of 190 nm to 650 nm can be obtained. Therefore, the mask can be formed so that the highly reliable test can be performed.

In the above-described structure 22, when the breadth of film quality controllability and the mass productivity are considered, the semitransparent film is preferably formed by the sputtering method at present.

In the above-described structure 23, the sputtering target is defined so that silicon and palladium are preferably contained.

In the above-described structure 24, it is defined that silicon and palladium contained in the sputtering target are in a relation represented by the equation (III).

According to the above-described structure 25, the superior fine processability can be realized by combining the semitransparent film obtained in the present invention with the dry etching process using the chlorine containing gas and/or the fluorine containing gas.

According to the above-described structure 26, by patterning the blank, it is possible to obtain the halftone phase shift mask which satisfies all the prescribed properties.

According to the above-described structure 27, the halftone phase shift mask provided with the desired optical properties can be obtained. Particularly it is possible to obtain the halftone phase shift mask which are provided with the desired optical properties with respect to the exposure lights such as the krypton fluoride (KrF) excimer laser light (248 nm), the argon fluoride (ArF) excimer laser light (193 nm) and the fluorine dimer ($F_2$) excimer laser light (157 nm).

According to the above-described structure 28, by using the halftone phase shift mask of the present invention to perform the pattern transfer, the transfer process for the shortened exposure wavelength can be realized.

According to the above-described structure 29, by using the halftone phase shift mask of the present invention to perform the pattern transfer, the semiconductor devices are obtained such as the semiconductor element to which the fine pattern for the shortened exposure wavelength is satisfactorily transferred.

BRIEF DESCRIPTION OF THE DRAWINGS

FIG. 7 is a diagram showing experiment results in examples 1 to 4 and comparative examples 1 to 5.

DETAILED DESCRIPTION OF THE PREFERRED EMBODIMENTS

Figure 1:
FIG. 1 is a schematic sectional view showing a halftone phase shift mask blank.
Figure 2:
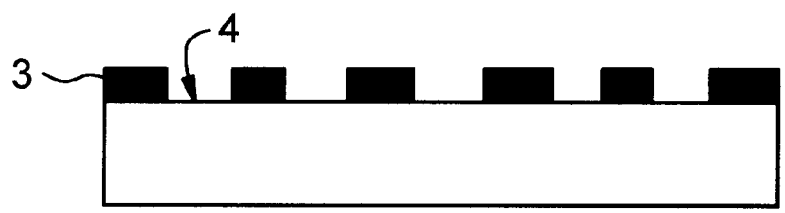
FIG. 2 is a schematic sectional view showing a halftone phase shift mask.

The present invention will be described hereinafter with reference to the drawings.

In the present invention, the main constituting elements of a semitransparent film (halftone phase shifter film) synergistically act, it is therefore possible to satisfy the basic prescribed properties such as the transmittance and refractive index with respect to an exposure wavelength and all the prescribed properties as a halftone phase shift mask such as the transmittance with respect to a test light wavelength, the optical resistance with respect to an exposure light, the chemical durability (resistance to chemicals) and the low defect density, but the respective elements mainly provide the following actions alone. Additionally, in order to satisfy not only the possibilities but also the actual prescribed properties, it is important to select and control the constituting element ratio and film quality (including the bond state, film structure, and the like).

Silicon contained in the semitransparent film is combined with nitrogen, oxygen, and hydrogen similarly contained in the film to form silicon nitride, silicon oxide, and silicon hydride, constitutes the main structure of the semitransparent film, rigidifies the film structure, and exerts an action to enhance the thermal and chemical stability.

Additionally, aluminum has the same action as that of silicon.

Nitrogen, oxygen, and hydrogen contained in the film change the properties as the halftone phase shifter film, alone or as a superposition.

Nitrogen in the film is effective not only for controlling the transmittance but also for changing the refractive index.

Oxygen in the film is effective mainly for the transmittance control. Particularly, in the ultraviolet wave range in which the light absorption occurs in many materials, in order to control the optical absorbing properties and transmission properties with good balance and obtain the desired semitransparent film, it is effective to introduce oxygen into the semitransparent film.

However, the introduction of excess oxygen into the film results in the increase of the proportion of oxide in the film, and results in the decrease of the semitransparent film refractive index in some cases. Since the phase shift angle is determined by the refractive index and film thickness with respect to the wavelength of a certain light as described above, the decrease of the refractive index means the increase of the film thickness necessary for obtaining the phase shift angle of 180°, and as a result the desired transmittance (transmission amount) cannot be obtained. Therefore, in order to function as the phase shifter with respect to the desired exposure wavelength, it is important to achieve a sufficient transmittance and a certain degree of refractive index. In order to avoid the decrease of the refractive index by the excess addition of oxygen, it is effective to introduce nitride into the film by adding nitrogen and enhance the refractive index.

Hydrogen in the film is effective for controlling the transmittance similarly as nitrogen and oxygen, additionally effectively terminates the dangling bond of the component elements in the film, and also effectively enhances the film stability with respect to the short-wavelength high-energy light such as the ultraviolet light.

Moreover, hydrogen is preferably contained together with nitrogen and/or oxygen in the film. In this case, the effect of hydrogen addition is remarkably fulfilled. For the three-component semitransparent film of silicon, palladium and hydrogen, the desired optical properties as the halftone film cannot be obtained in some cases, and the film stability is possibly deteriorated.

Additionally, the introduction amount of hydrogen needs to be determined in consideration of the thermal stability and photochemical stability in the film.

Palladium in the film satisfies the basic prescribed properties such as the transmittance and refractive index with respect to the exposure wavelength by selecting and controlling the film composition including palladium (the constituting elements and the ratio) and film quality (including the bond state and film structure), and palladium is particularly effective to obtain the semitransparent film provided with the transmittance of 40% or less with respect to the desired test light in the test light wave range of 190 nm to 650 nm.

Moreover, palladium in the film, alone or together with the other metal or transition metal elements, is effective for the enhancement of the electric properties, optical properties and chemical durability of the film. Specifically, it is possible to achieve the enhancement of the film conductivity as the improvement of the electric properties, the transmittance control in the exposure wavelength and the improvement of the transmittance in the test light wave range of the mask as the improvement of the optical properties, and the improvement of the durability against acids and alkalis used in the mask cleaning process as the improvement of the chemical durability.

The metal or transition metal element may appropriately be selected as the metal or transition metal element M in the film so that the desired optical properties can be achieved, and above all cobalt, tantalum, tungsten, molybdenum, chromium, vanadium, titanium, niobium, zinc, zirconium, hafnium, germanium, aluminum, platinum, manganese, iron, and the like are effective for the control and improvement of the electric and optical properties and chemical durability of the film.

Additionally, even when the elements contained in the film and the ratio of the elements are the same, the optical and other properties of the film are fulfilled by the substantial bonds contained in the film, and it is therefore important to define the substantial bonds contained in the film. Furthermore, it is important that these bonds are contained by the predetermined amount to fulfill the predetermined properties, and are uniformly distributed and that the film of the amorphous structure is formed by the bond state.

Specifically, for example, when the bond of silicon to at least one selected from nitrogen, oxygen and hydrogen is insufficient, it is difficult to enhance the film denseness. Moreover, when the proportion of silicon present alone in the film increases, the chemical durability and optical properties of the film are possibly deteriorated. For the other bonds, the film denseness, chemical durability, optical properties and optical resistance, and the like are deteriorated depending on the presence/absence or the amount of the bonds.

When the film structure is amorphous, the stress generated in the film can appropriately be controlled to obtain the desired value, and additionally birefringence, scattering and other phenomena which optically deteriorate the transfer properties are not easily caused. Furthermore, in the lithography process in which the mask is finally formed by patterning, the processability of the fine pattern is remarkably enhanced.

To govern the substantial bond contained in the film, it is necessary to select the film forming method and condition, film composition, target composition, and the like.

Therefore, the semitransparent film in the present invention substantially contains at least the Pd—Si bond, Pd—N bond, Pd—O bond or Pd—H bond, and the Si—N bond, Si—O bond or Si—H bond, and substantially contains the M—Si bond, M—N bond as occasion demands, and further comprises the amorphous structure film, which is preferable for the control and improvement of the prescribed properties.

Additionally, a symbol "-" in each bond type means the bond between atoms, and includes not only a single bond but also a multiple bond and other bond states (e.g., the middle bond between the single bond and a double bond).

In the halftone phase shift mask blank of the present invention, a reflection preventive layer, etching stop layer, etching mask layer, and other layers can be formed as occasion demands. Moreover, the transparent substrate may be transparent to the exposure light and test light, and the substrate materials, and the like are not particularly limited.

A method of manufacturing the halftone phase shift mask blank of the present invention will next be described.

Examples of a method of forming the semitransparent film include a sputter film forming method, deposition method, chemical vapor development method (CVD), ion beam deposition method, electron ray deposition method and other various thin film forming methods.

Among these, when the mass producibility and manufacture yield of the mask material, the stability, and the like are considered, at present, the sputter film forming method using the sputtering target and gas containing the semitransparent film constituting elements is effective.

Among the main constituting elements of the semitransparent film, for nitrogen, oxygen, and hydrogen, there are a method of introducing those elements into the film by a reactive sputter method using the sputter gas containing these elements, and a method of containing these elements in the target and introducing the target into the film.

In plasma discharge (reactive sputter method) in which an oxygen gas is introduced, the abnormal discharge by an insulating oxide formed on a target surface often raises a problem. The abnormal discharge is caused on the target surface and fine particles are generated. The particles are taken into the semitransparent film, and remarkably deteriorate the quality of the halftone phase shifter as the defects in the film.

For the materials in the present invention, an oxide can be contained beforehand in the target. For example, for the target of silicon and palladium, silicon oxide and palladium oxide may be contained in the target. For a high-frequency discharge, the discharge is possible irrespective of the conductivity of the target, and the proportion of the oxide is not limited. For a direct-current discharge or an alternating-current discharge, the oxide may be contained in the target in a range of conductivity suitable for each discharge system. By containing the oxide in the target in this manner, the abnormal discharge is decreased and additionally the oxide can efficiently be introduced into the film. Additionally, by adding nitrogen and hydrogen instead of oxygen, the abnormal discharge in plasma easily generated during the oxygen reactive sputtering is decreased, and the number of defects in the semitransparent film is effectively reduced.

For nitrogen, similarly as oxygen, when a nitride or an acid nitride is contained in the target, the nitride can efficiently be introduced into the film.

Additionally, nitrogen and hydrogen may be introduced into the film via the sputter gas because, as compared with oxygen, the abnormal discharge during the reactive sputter is not easily caused.

Examples of the sputter gas include, in addition to nitrogen, oxygen and hydrogen, gases containing these elements, such as nitrogen monoxide, nitrogen dioxide, dinitrogen monoxide, laughing gas, ammonia gas, ozone, and water. When these gases are used alone or as a mixture, or mixed and used with gases such as helium, argon, and xenon, nitrogen, oxygen, and hydrogen can easily be taken into the film. The target composition and gas composition may appropriately be selected so that the intended film composition and properties are finally obtained.

Moreover, the sputter system (direct-current sputter, high-frequency sputter, alternating-current sputter, and the like) or the sputter conditions such as sputter output, gas pressure, and presence/absence of substrate heating may appropriately be selected in accordance with the materials of the semitransparent film and the intended film composition and properties.

The halftone phase shift mask of the present invention is obtained by using the above-described halftone phase shift mask blank of the present invention, and forming the semitransparent mask pattern to be transferred to the wafer on the transparent substrate.

The lithography method is used in patterning the semitransparent film, and the like on the blank. As the lithography method, the method for use in a general mask manufacture process can be applied, but for example in the patterning of the semitransparent film of the present invention, a dry etching system can preferably be used in which fluorine containing gases such as $CF_4$, $C_2F_6$, $CHF_2$, $SF_4$, $NF_3$, chlorine containing gases such as $Cl_2$ and $CH_2CL_2$, oxygen containing gases such as $O_2$, $O_3$, $H_2O$, and other etching gases are appropriately mixed and used. Additionally, in the dry etching, it is also effective to mix and use the above-described etching gas with argon, hydrogen, helium and other gases and control the etching properties.

EXAMPLES

Examples will be described hereinafter.

Example 1

In an example 1, by using a composite sputter target of silicon and palladium, and using the gas obtained by mixing Ar and $N_2$ at a ratio of about 1:4 in terms of the flow ratio as the sputter gas, the semitransparent film (halftone phase shifter film) was formed on the quartz substrate by the direct-current sputter film formation. For the sputter gas introduction condition, the total introduction amount of the mixture gas was set to 30 SCCM, and the pressure in a device during sputtering was set to 3 mTorr by a pressure adjuster disposed right above an exhaust pump. In this case, the amount of palladium in the target was adjusted so that the ratio of [atom % of palladium in the film] to [atom % of palladium in the film+atom % of silicon in the film] was about 20%. Concretely, the ratio of [atom % of palladium in the target] to [atom % of palladium in the target+atom % of silicon in the target] was set to 20%.

Figure 3:
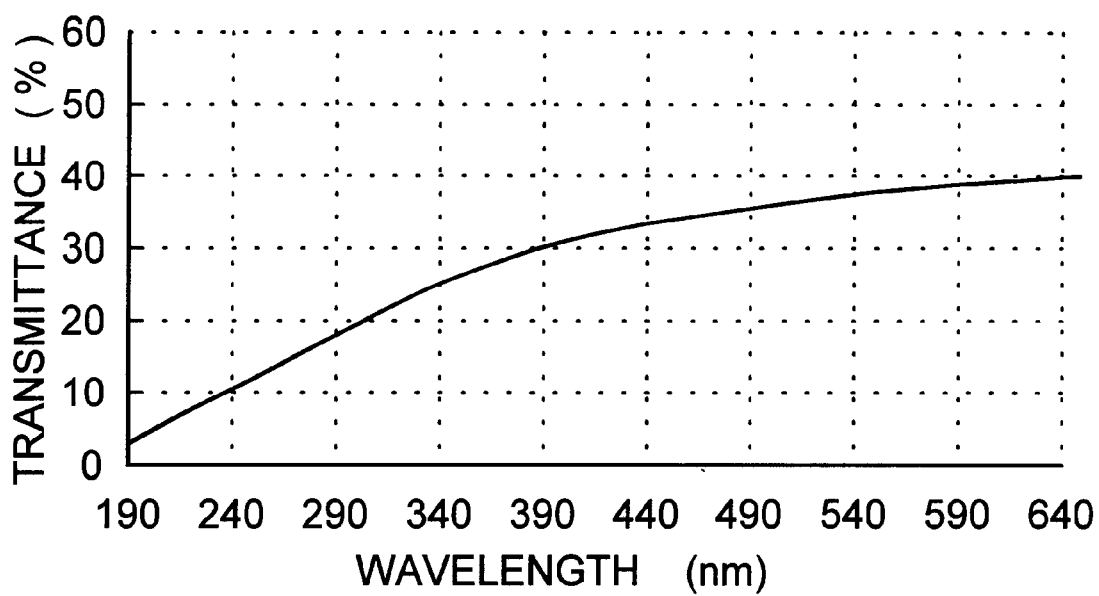
FIG. 3 is a diagram showing a spectral transmittance in the ultraviolet to visible light area of a semitransparent film in a first embodiment.

Regarding the halftone phase shifter film formed on the quartz substrate in this manner, when the film thickness was measured in a contact finger method, and the transmittance was measured using a spectrophotometer, the film thickness was 709 angstroms, and the spectral transmittance in 193 nm was 3.5% (FIG. 3). Moreover, the refractive index (n) was calculated from the refractive index, transmittance, and film thickness of the film similarly measured using the spectrophotometer, the refractive index (n) indicated a value of 2.36, and the sufficient value was confirmed in shifting the phase of the light with a wavelength of 193 nm by 180° in a film thickness of 709 angstroms.

Furthermore, the spectral transmittance in the test light wavelength of 364 nm was similarly measured and indicated 28.1%.

For the formed halftone phase shifter film, the ratio of [atom % of palladium in the film] to [atom % of palladium in the film+atom % of silicon in the film] was 19%. The measurement was performed by an X-ray photoelectron spectral method (XPS).

Moreover, when the formed halftone phase shifter film was similarly measured using the XPS, the total amount of silicon, palladium and nitrogen in the film was 56 atom %.

Furthermore, when the formed halftone phase shifter film was similarly measured using the XPS, the contents of silicon, palladium, and nitrogen in the film were 45 atom %, 11 atom %, and 43 atom %, respectively.

Results are shown in FIG. 7.

The chemical durability of the formed halftone phase shifter film was evaluated by immersion to an acid and a film quality change before and after the immersion. After immersing the halftone phase shifter film with a film thickness of 709 angstroms and spectral transmittance of 3.5% in 193 nm to concentrated sulfuric acid heated to 90° C. to 100° C., and performing measurement similarly as described above, the film thickness was 697 angstroms, the spectral transmittance in 193 nm was 3.7%, the deviation of the phase shift angle brought by the immersion to the acid is within 30 and a sufficient resistance to hot concentrated sulfuric acid was indicated. Similarly, the sufficient resistance to the chemical solution was confirmed even during the immersion to aqueous persulfuric acid obtained by mixing a hydrogen peroxide solution and sulfuric acid at a ratio of 1:4 at 120° C. for 120 minutes.

For the irradiation resistance of the formed halftone phase shifter film, the ArF excimer laser having an oscillation wavelength in 193 nm was radiated, and the film transmittance, refractive index and film thickness were evaluated before and after the irradiation. As a result, before and after the ArF excimer laser with an irradiation energy density of 1 mJ/cm$^2$ per single pulse was radiated by $10^7$ pulses, no significant change was found in the transmittance, refractive index and film thickness, and the properties of the halftone phase shifter film were very stable.

The etching of the formed halftone phase shifter film was performed by a reactive ion etching. In this case, the chlorine gas was used as the etching gas. As a result, it was confirmed that the etching could satisfactorily be performed with an etching selection ratio about three times that of the quartz substrate. Moreover, since the film structure was amorphous, an etching pattern side wall was smooth.

As described above in the example 1, the thin film provided with both the satisfactory film quality and optical properties was easily formed as the halftone phase shifter film.

Additionally, for comparison, when the ratio of [atom % of palladium in the film] to [atom % of palladium in the film+atom % of silicon in the film] was less than 10%, the spectral transmittance in the test light wavelength exceeded 40% (see comparative example 3).

Example 2

In an example 2, by using the composite sputter target of silicon and palladium, and using the gas obtained by mixing Ar, N$_2$, and O$_2$ at a ratio of about 10:37:3 in terms of the flow ratio as the sputter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump. In this case, the amount of palladium in the target was adjusted so that the ratio of [atom % of palladium in the film] to [atom % of palladium in the film+atom % of silicon in the film] was about 20%. Concretely, the ratio of [atom % of palladium in the target] to [atom % of palladium in the target+atom % of silicon in the target] was set to 20%.

Regarding the halftone phase shifter film formed on the quartz substrate in this manner, when the film thickness was measured in the contact finger method, and the transmittance was measured using the spectrophotometer, the film thickness was 1127 angstroms, and the spectral transmittance in 193 nm was 9.1%. Moreover, the refractive index (n) was calculated from the refractive index, transmittance, and film thickness of the film similarly measured using the spectrophotometer, the refractive index (n) indicated a value of 1.88 and it was confirmed that the value was sufficient in shifting the phase of the light with the wavelength of 193 nm by 180° in the film thickness of 1127 angstroms.

Furthermore, the spectral transmittance in the test light wavelength of 364 nm was similarly measured and indicated 36.2%.

For the formed halftone phase shifter film, the ratio of [atom % of palladium in the film] to [atom % of palladium in the film+atom % of silicon in the film] was 19%. Moreover, the total amount of silicon, palladium and nitrogen in the film was 46 atom %. The contents of silicon and palladium in the film were 37 atom % and 9 atom %, respectively.

Figure 4:
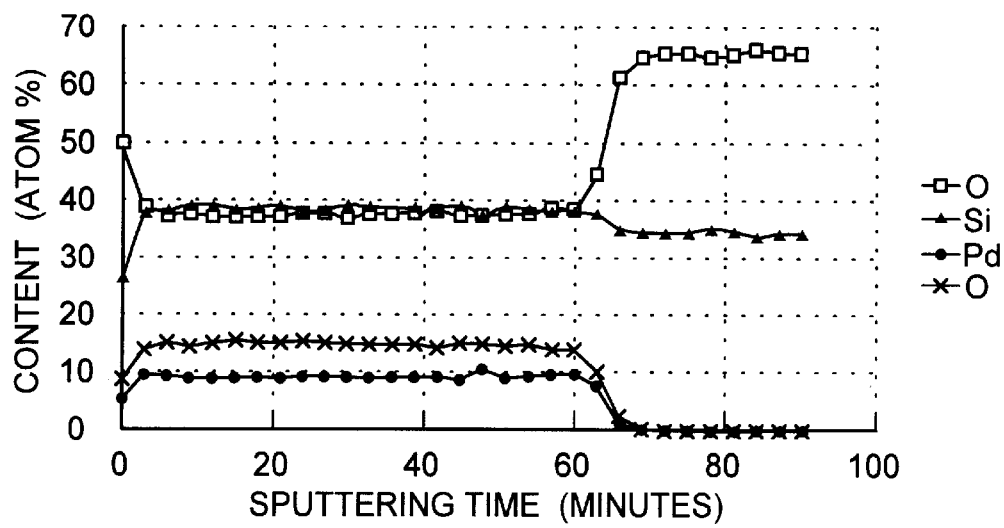
FIG. 4 is a diagram showing a depth direction composition analysis result obtained by measurement using XPS with respect to the semitransparent film in a second embodiment.

Moreover, when the formed halftone phase shifter film was similarly measured using the XPS, the content of nitrogen in the film was 15 atom %, and the content of oxygen was 37 atom % (FIG. 4). Additionally, FIG. 4 is a diagram showing the composition analysis result in a depth direction in the measurement using the XPS, the abscissa indicates the sputtering time (minutes), and the ordinate indicates the content (atom %).

The results are shown in FIG. 7.

The chemical durability of the formed halftone phase shifter film was evaluated by the changes of the film quality and optical properties before and after the immersion to the acid similarly as the example 1. As a result, the deviations of the phase shift angle before and after the immersion to hot concentrated sulfuric acid and aqueous persulfuric acid were both 20 or less, the change of the transmittance was 0.1% or less, and the very satisfactory resistance to chemical solutions was confirmed.

For the irradiation resistance of the formed halftone phase shifter film, before and after the ArF excimer laser with the oscillation wavelength in 193 nm and the irradiation energy density of 1 mJ/cm$^2$ per single pulse was radiated by $10^7$ pulses similarly as the example 1, the changes of the transmittance, refractive index and film thickness were measured, but no significant change was found, and the properties of the halftone phase shifter film were very stable.

The etching of the formed halftone phase shifter film was performed by the reactive ion etching similarly as the example 1. In this case, the chlorine gas was used as the etching gas. As a result, it was confirmed that the etching could satisfactorily be performed with the etching selection ratio about 2.5 times that of the quartz substrate. Moreover, since the film structure was amorphous, the etching pattern side wall was smooth.

As described above in the example 2, the thin film provided with both the satisfactory film quality and optical properties was easily formed as the halftone phase shifter film.

Moreover, in the example 2, by introducing oxygen into the film, the transmittance in the exposure wave range was enhanced, and the high refractive index was maintained by the action of nitrogen in the film. Here, by introducing an appropriate amount of Pd in the film, the optical absorption and transmission properties are controlled with good balance.

Additionally, for comparison, when the ratio of [atom % of palladium in the film] to [atom % of palladium in the film+atom % of silicon in the film] exceeded 40%, the spectral transmittance in the exposure wavelength was less than 3% (see comparative example 4).

Example 3

In an example 3, by using the composite sputter target of silicon, palladium and vanadium, and using the gas obtained by mixing Ar and $N_2$ at a ratio of about 1:4 in terms of the flow ratio as the sputter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump. Additionally, the ratio of [atom % of palladium in the-target] to [atom % of palladium in the target+atom % of silicon in the target] was set to 8%.

Regarding the halftone phase shifter film formed on the quartz substrate in this manner, when the film thickness was measured in the contact finger method, and the transmittance was measured using the spectrophotometer, the film thickness was 697 angstroms, and the spectral transmittance in 193 nm was 4.1%. Moreover, the refractive index (n) was calculated from the refractive index, transmittance, and film thickness of the film similarly measured using the spectrophotometer, the refractive index (n) indicated a value of 2.41, and it was confirmed that the value was sufficient in shifting the phase of the light with the wavelength of 193 nm by 180° in the film thickness of 697 angstroms.

Furthermore, the spectral transmittance in the test light wavelength of 364 nm was similarly measured and indicated 36.1%.

When the formed halftone phase shifter film was measured using the X-ray photoelectron spectral method (XPS), the ratio of [atom % of palladium in the film] to [atom % of palladium in the film+atom % of silicon in the film] was 8%. Moreover, the total amount of silicon, palladium and nitrogen in the film was 45 atom %.

Moreover, when the formed halftone phase shifter film was similarly measured using the XPS, the contents of silicon, palladium, vanadium, and nitrogen in the film were 41 atom %, 4 atom %, 10 atom %, and 44 atom %, respectively.

The results are shown in FIG. 7.

The chemical durability of the formed halftone phase shifter film was evaluated by the changes of the film quality and optical properties before and after the immersion to the acid similarly as the example 1. As a result, the deviations of the phase shift angle before and after the immersion to hot concentrated sulfuric acid and aqueous persulfuric acid were both 1.50 or less, the change of the transmittance was also 0.2% or less, and the very satisfactory resistance to chemical solutions was confirmed.

For the irradiation resistance of the formed halftone phase shifter film, before and after the ArF excimer laser with the oscillation wavelength in 193 nm and the irradiation energy density of 1 mJ/cm$^2$ per single pulse was radiated by $10^7$ pulses similarly as the example 1, the changes of the transmittance, refractive index and film thickness were measured, but no significant change was found, and the properties of the halftone phase shifter film were very stable.

The etching of the formed halftone phase shifter film performed by the reactive ion etching similarly as the example 1. In this case, the chlorine gas was used as the etching gas. As a result, it was confirmed that the etching could satisfactorily be performed with the etching selection ratio about 8.0 times that of the quartz substrate. Moreover, since the film structure was amorphous, the etching pattern side wall was smooth.

As described above in the example 3, since the four-element material was used, the etching selection ratio increased with respect to the quartz substrate, and the thin film provided with both the satisfactory film quality and processability was easily formed as the halftone phase shifter film.

For comparison, when the ratio of [atom % of palladium in the film] to [atoms of palladium in the film+atom % of silicon in the film] was less than 5%, the spectral transmittance in the test light wavelength exceeded 40% (see comparative example 5).

Example 4

In an example 4, by using the composite sputter target of silicon, palladium and vanadium, and using the gas obtained by mixing Ar, $N_2$ and $O_2$ at a ratio of about 10:38:2 in terms of the flow ratio as the sputter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump. Additionally, the ratio of [atom % of palladium in the target] to [atom % of palladium in the target+atom % of silicon in the target] was set to 8%.

Figure 5:
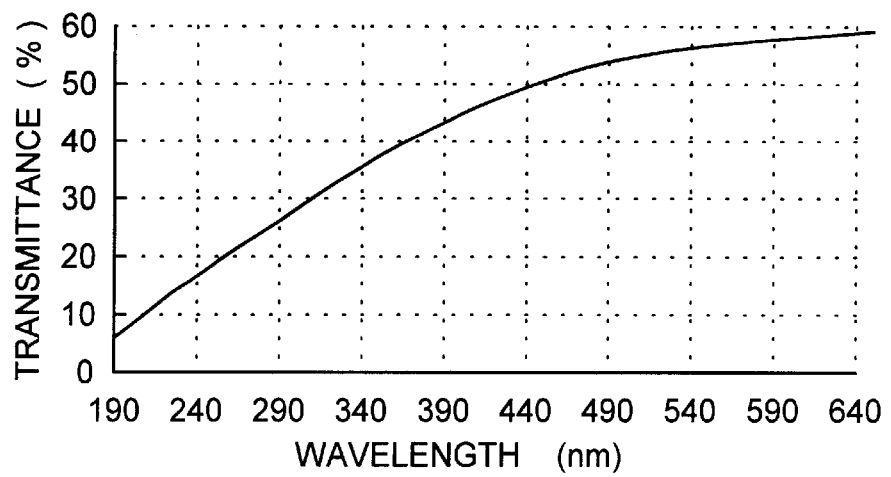
FIG. 5 is a diagram showing the spectral transmittance in the ultraviolet to visible light area of the semitransparent film in a fourth embodiment.

Regarding the halftone phase shifter film formed on the quartz substrate in this manner, when the film thickness was measured in the contact finger method, and the transmittance was measured using the spectrophotometer, the film thickness was 1006 angstroms, and the spectral transmittance in 193 nm was 6.0% (FIG. 5). Moreover, the refractive index (n) was calculated from the refractive index, transmittance, and film thickness of the film similarly measured using the spectrophotometer, the refractive index (n) indicated a value of 1.99, and it was confirmed that the value was sufficient in shifting the phase of the light with the wavelength of 193 nm by 180° in the film thickness of 1006 angstroms.

Furthermore, the spectral transmittance in the test light wavelength of 364 nm was similarly measured and indicated 39.8%.

When the formed halftone phase shifter film was measured using the X-ray photoelectron spectral method (XPS), the ratio of [atom % of palladium in the film] to [atom % of palladium in the film+atom % of silicon in the film] was 8%. Moreover, the total amount of silicon, palladium and nitrogen in the film was 41 atom %.

Moreover, when the formed halftone phase shifter film was similarly measured using the XPS, the contents of silicon, palladium, vanadium, nitrogen, and oxygen in the film were 37 atom %, 4 atom %, 9 atom %, 12 atom %, and 38 atom %, respectively.

The results are shown in FIG. 7.

The chemical durability of the formed halftone phase shifter film was evaluated by the changes of the film quality and optical properties before and after the immersion to the acid similarly as the example 1. As a result, the deviations of the phase shift angle before and after the immersion to hot concentrated sulfuric acid and aqueous persulfuric acid were both 1° or less, the change of the transmittance was also 0.1% or less, and the very satisfactory resistance to chemical solutions was confirmed.

For the irradiation resistance of the formed halftone phase shifter film, before and after the ArF excimer laser with the oscillation wavelength in 193 nm and the irradiation energy density of 1 mJ/cm$^2$ per single pulse was radiated by $10^7$ pulses similarly as the example 1, the changes of the transmittance, refractive index and film thickness were measured, but no significant change was found, and the properties of the halftone phase shifter film were very stable.

The etching of the formed halftone phase shifter film was performed by the reactive ion etching similarly as the example 1. In this case, the chlorine gas was used as the etching gas. As a result, it was confirmed that the etching could satisfactorily be performed with the etching selection ratio about 5.1 times that of the quartz substrate. Moreover, since the film structure was amorphous, the etching pattern side wall was smooth.

As described above in the example 4, since the five-element material was used, the particularly superior resistance to chemical solutions and the satisfactory etching selection ratio with respect to the quartz substrate were obtained, and the thin film provided with both the satisfactory film quality and processability was easily formed as the halftone phase shifter film.

For comparison, when the ratio of [atom % of palladium in the film] to [atom % of palladium in the film+atom % of silicon in the film] exceeded 40%, the spectral transmittance in the exposure wavelength was less than 3%.

Example 5

The evaluation was performed similarly as the examples 3 and 4 except that the target and gas compositions were appropriately adjusted using tungsten, molybdenum, titanium, niobium, zirconium, and hafnium, instead of vanadium. As a result, similarly as the examples 3 and 4, it was confirmed that the thin film provided with both the satisfactory film quality and optical properties was easily formed as the halftone phase shifter film.

Comparative Example 1

In a comparative example 1, by using the sputter target of silicon, and using the gas obtained by mixing Ar and $N_2$ at a ratio of about 1:4 in terms of the flow ratio as the sputter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump.

Figure 6:
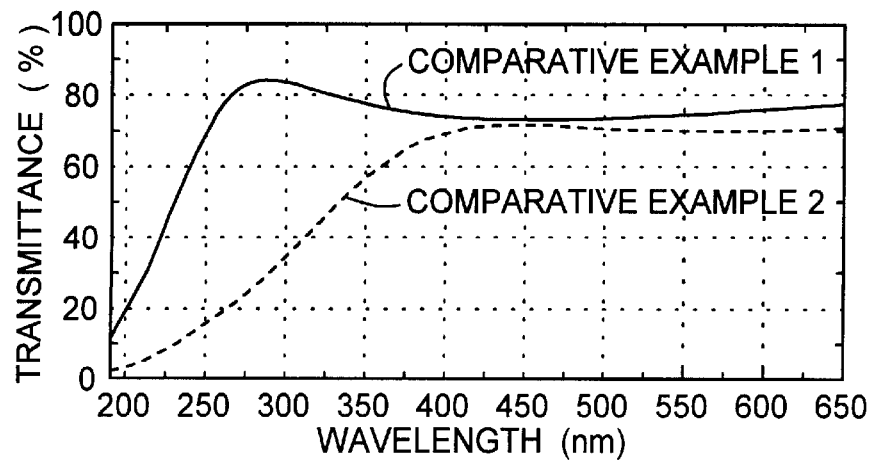
FIG. 6 is a diagram showing the spectral transmittance in the ultraviolet to visible light area of the semitransparent film in comparative examples 1 and 2.

Regarding the halftone phase shifter film formed on the quartz substrate in this manner, when the film thickness was measured in the contact finger method, and the transmittance was measured using the spectrophotometer, the film thickness was 607 angstroms, and the spectral transmittance in 193 nm was 14.3% (FIG. 6). Moreover, the refractive index (n) was calculated from the refractive index, transmittance, and film thickness of the film similarly measured using the spectrophotometer, the refractive index (n) indicated a value of 2.63, and it was confirmed that the value was sufficient in shifting the phase of the light with the wavelength of 193 nm by 180° in the film thickness of 607 angstroms.

However, in the similar measurement in the test light wavelength of 364 nm, the spectral transmittance was 76.6%, and largely exceeded the upper limit of the testable transmittance.

Comparative Example 2

In a comparative example 2, by using the sputter target of silicon, and using the gas obtained by mixing Ar and $N_2$ at a ratio of about 1:4 in terms of the flow ratio as the sputter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump.

Regarding the halftone phase shifter film formed on the quartz substrate in this manner, when the film thickness was measured in the contact finger method, and the transmittance was measured using the spectrophotometer, the film thickness was 784 angstroms, and the spectral transmittance in 193 nm was 1.89% (FIG. 6). Moreover, the refractive index (n) was calculated from the refractive index, transmittance, and film thickness of the film similarly measured using the spectrophotometer, the refractive index (n) indicated a value of 2.25, and it was confirmed that the value was sufficient in shifting the phase of the light with the wavelength of 193 nm by 180° in the film thickness of 784 angstroms.

In the comparative example 2, in order to reduce the transmittance in the test light wavelength of the halftone phase shifter film according to the comparative example 1, the amount of nitrogen in the film was reduced.

However, when the measurement in the test light wavelength of 364 nm was performed as described above, the spectral transmittance was 62.3%, and largely exceeded the upper limit of the testable transmittance. Moreover, the transmittance in 193 nm lowered below the adequate lower limit of the halftone phase shifter.

Comparative Example 3

In a comparative example 3, by using the sputter target of silicon and palladium, and using the gas obtained by mixing Ar and $N_2$ at a ratio of about 1:4 in terms of the flow ratio as the sputter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump. In this case, the amount of palladium in the target was adjusted so that the ratio of [atom % of palladium in the film] to [atom % of palladium in the film+atom % of silicon in the film] was about 4.5%. Concretely, the ratio of [atom % of palladium in the target] to [atom % of palladium in the target+atom % of silicon in the target] was set to 7.7%.

Regarding the halftone phase shifter film formed on the quartz substrate in this manner, when the film thickness was measured in the contact finger method, and the transmittance was measured using the spectrophotometer, the film thickness was 623 angstroms, and the spectral transmittance in 193 nm was 11%. Moreover, the refractive index (n) was calculated from the refractive index, transmittance, and film thickness of the film similarly measured using the spectrophotometer, the refractive index (n) indicated a value of 2.55, and it was confirmed that the value was sufficient in shifting the phase of the light with the wavelength of 193 nm by 180° in the film thickness of 623 angstroms.

However, in the similar measurement in the test light wavelength of 364 nm, the spectral transmittance was 68%, and largely exceeded the upper limit of the testable transmittance. This is because the following ratio of palladium in the film is less than 10%.

When the formed halftone phase shifter film was measured using the X-ray photoelectron spectral method (XPS), the ratio of [atom % of palladium in the film] to [atom % of palladium in the film+atom % of silicon in the film] was 4.5%. Moreover, the total amount of silicon, palladium and nitrogen in the film was 44 atom %.

Moreover, when the formed halftone phase shifter film was similarly measured using the XPS, the contents of silicon, palladium, and nitrogen in the film were 42 atom %, 2 atom %, and 56 atom %, respectively.

The results are shown in FIG. 7.

Comparative Example 4

In a comparative example 4, by using the composite sputter target of silicon and palladium, and using the gas obtained by mixing Ar, $N_2$ and $O_2$ at a ratio of about 5:5:1 in terms of the flow ratio as the spatter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump. In this case, the amount of palladium in the target was adjusted so that the ratio of [atom % of palladium in the film] to [atom % of palladium in the film+atom % of silicon in the film] was about 50%. Concretely, the ratio of [atom % of palladium in the target] to [atom % of palladium in the target+atom % of silicon in the target] was set to 49%.

Regarding the halftone phase shifter film formed on the quartz substrate in this manner, when the film thickness was measured in the contact finger method, and the transmittance was measured using the spectrophotometer, the film thickness was 919 angstroms, the spectral transmittance in 193 nm was 0%, and the film could not function as the halftone phase shifter film. This is because the following total amount of silicon and palladium in the film exceeds 67 atom %, and the ratio of palladium in the film exceeds 40%. Moreover, the refractive index (n) was calculated from the refractive index, transmittance, and film thickness of the film similarly measured using the spectrophotometer, the refractive index (n) indicated a value of 2.05, and it was confirmed that the value was sufficient in shifting the phase of the light with the wavelength of 193 nm by 180° in the film thickness of 919 angstroms.

Moreover, in the similar measurement in the test light wavelength of 364 nm, the spectral transmittance was 0.8%.

When the formed halftone phase shifter film was measured using the X-ray photoelectron spectral method (XPS), the ratio of [atom % of palladium in the film] to [atom % of palladium in the film+atom % of silicon in the film] was 49%, and the total amount of silicon, palladium and nitrogen in the film was 71 atom %.

Moreover, when the formed halftone phase shifter film was similarly measured using the XPS, the contents of silicon, palladium, nitrogen, and oxygen in the film were 36 atom %, 35 atom %, 9 atom %, and 20 atom %, respectively.

The results are shown in FIG. 7.

Comparative Example 5

In a comparative example 5, by using the composite sputter target of silicon, palladium, and vanadium, and using the gas obtained by mixing Ar and $N_2$ at a ratio of about 1:3 in terms of the flow ratio as the sputter gas, the semitransparent film (halftone phase shifter film) was formed on the quartz substrate by the direct-current sputter film formation. For the sputter gas introduction condition, the total introduction amount of the mixture gas was 30 SCCM, and the pressure in the device during sputtering was set to 3 mTorr by the pressure adjuster disposed right above the exhaust pump. Additionally, the ratio of [atom % of palladium in the target] to [atom % of palladium in the target+atom % of silicon in the target] was set to 4.9%.

Regarding the halftone phase shifter film formed on the quartz substrate in this manner, when the film thickness was measured in the contact finger method, and the transmittance was measured using the spectrophotometer, the film thickness was 684 angstroms, the spectral transmittance in 193 nm was 1.0%, and the spectral transmittance in the exposure wavelength was less than 3% and lowered below the adequate value of the halftone phase shifter. This is because the following content of vanadium in the film exceeds 20 atom %. Moreover, the refractive index (n) was calculated from the refractive index, transmittance, and film thickness of the film similarly measured using the spectrophotometer, the refractive index (n) indicated a value of 2.41, and it was confirmed that the value was sufficient in shifting the phase of the light with the wavelength of 193 nm by 180° in the film thickness of 684 angstroms.

Moreover, in the similar measurement in the test light wavelength of 364 nm, the spectral transmittance was 49%, and exceeded the upper limit of the testable transmittance. This is because the ratio of palladium in the film is less than 5%.

When the formed halftone phase shifter film was measured using the X-ray photoelectron spectral method (XPS), the ratio of [atom % of palladium in the film] to [atom % of palladium in the film+atom % of silicon in the film] was 4.9%, and the total amount of silicon, palladium and nitrogen in the film was 39 atom %.

Moreover, when the formed halftone phase shifter film was similarly measured using the XPS, the contents of silicon, palladium, vanadium, and nitrogen in the film were 39 atom %, 2 atom %, 27 atom %, and 33 atom %, respectively.

The results are shown in FIG. 7.

Example 6

By using the halftone phase shift mask blank obtained by forming the halftone phase shifter film (semitransparent film) on the quartz substrate in the examples 1 to 5, and patterning the halftone phase shifter film (semitransparent film), the halftone phase shift mask was formed.

By using these halftone phase shift masks, using the ArF excimer laser (193 nm) as the exposure light, and subjecting the semiconductor wafer and other materials to be transferred to pattern transfer treatments such as exposure and development, the semiconductor devices such as the semiconductor element with the fine pattern satisfactorily transferred thereto could be obtained.

The present invention has been described by way of the examples, but the above-described examples only illustrate the embodiments of the present invention, and do not limit the present invention by the conditions and performed contents.

For example, in order to perform the direct-current sputter in the embodiment, the necessary condition is that the sputter target has a certain degree of conductivity. However, when the target is constituted by a semi-insulator, a non-conductor and other materials in which it is difficult to perform the direct-current discharge, a slight amount of the materials for imparting conductivity to the target, such as boron may be added to such an extent that the properties of the finally formed film as the halftone phase shifter are not deteriorated. Conversely, when the target material has an excellent conductivity, the insulator or semiconductor material may be added to the target to such an extent that the discharge and film properties are not inhibited. For the discharge system, in addition to the high-frequency discharge system, a high-frequency discharge system in which the plasma discharge is not easily influenced by the target conductivity, or an alternating-current discharge system can substantially be used. In any case, however, it is important to minimize the defects in the film during the forming of the desired film.

Moreover, the substance and mixture ratio of the gas used for the sputter are not limited to those of the examples, and for example, an Xe gas or an He gas instead of Ar, nitrogen containing gases such as $NH_3$, $NO_2$, NO instead of $N_2$, or a gas containing these components can appropriately be selected or mixed and used.

Furthermore, the etching method of the halftone phase shifter film is not limited to the methods shown in the example, and the etching system, etching gas, detailed etching condition, and the like can be selected/set to be optimum.

Moreover, as the transparent substrate, instead of the quartz substrate, fluorite and other various types of glass substrates (e.g., hydrofluoric phosphoric acid glass, hydrofluoric boric acid glass) may be used.

As described above, according to the present invention, all the prescribed properties of the halftone phase shift mask and the phase shift mask blank as the material of the mask can be satisfied.

Specifically, the semitransparent film (halftone phase shifter film) in the present invention is provided with the desired transmittance and refractive index with respect to the exposure wavelength of 248 nm or 193 nm. Therefore, the shortened exposure wavelength can basically be handled.

Moreover, the semitransparent film in the present invention is provided with the desired transmittance with respect to the test light wavelength. Therefore, the mask suitable for practical use can be formed so that the highly reliable test can be performed.

Furthermore, the semitransparent film in the present invention is stable against the high-energy short-wavelength light, is sufficiently resistant to the chemicals used in the mask manufacture process, is little in the defects in the film and is excellent in the fine processability. Therefore, the superior phase shift mask to cope with the shortened exposure wavelength can easily be provided under a high mass producibility.

What is claimed is:

1. A halftone phase shift mask blank for forming a phase shift mask, constituted by forming a semitransparent film which produces a predetermined amount of phase difference with respect to a light transmitted directly through a transparent substrate and attenuates light intensity on said transparent substrate,
wherein said semitransparent film contains silicon, palladium, and at least one selected from the group consisting of nitrogen, oxygen and hydrogen.

2. The halftone phase shift mask blank according to claim 1 wherein the total amount of silicon and palladium in said semitransparent film is in a range of 30 to 67 atom %.

3. The halftone phase shift mask blank according to claim 2 wherein silicon and palladium contained in said semitransparent film are in a relation represented by the following equation (I):

[atom % of palladium in the film]/[(atom % of palladium in the film)+(atom % of silicon in the film)]×100=10 to 40(%)     Equation (I).

4. The halftone phase shift mask blank according to claim 3 wherein at least one selected from the group consisting of nitrogen, oxygen and hydrogen contained in said semitransparent film forms a chemical bond to silicon.

5. The halftone phase shift mask blank according to claim 2 wherein at least one selected from the group consisting of nitrogen, oxygen and hydrogen contained in said semitransparent film forms a chemical bond to silicon.

6. The halftone phase shift mask blank according to claim 1 wherein at least one selected from the group consisting of nitrogen, oxygen and hydrogen contained in said semitransparent film forms a chemical bond to silicon.

7. The halftone phase shift mask blank according to claim 1 wherein said semitransparent film contains silicon, palladium, and nitrogen.

8. The halftone phase shift mask blank according to claim 7 wherein the content of nitrogen in said semitransparent film is more than 0 and not more than 60 atom %.

9. The halftone phase shift mask blank according to claim 8, wherein the content of nitrogen in said semitransparent film is more than 0 and not more than 50 atom %.

10. The halftone phase shift mask blank according to claim 1 wherein said semitransparent film contains oxygen in a range of 0 to 65 atom %.

11. The halftone phase shift mask blank according to claim 10 wherein said semitransparent film contains oxygen in a range of 3 to 50 atom %.

12. The halftone phase shift mask blank according to claim 1 wherein said semitransparent film has a transmittance of 40% or less with respect to a desired test light in a test light wave range of 190 nm to 650 nm of the phase shift mask blank and the phase shift mask.

13. A method of manufacturing a halftone phase shift mask blank, comprising the steps of: using a sputtering target and a gas containing the constituting elements of the semitransparent film according to claim 1 and forming the semitransparent film on a transparent substrate by a sputtering method.

14. The method of manufacturing the halftone phase shift mask blank according to claim 13 wherein said sputtering target contains silicon and palladium.

15. The method of manufacturing the halftone phase shift mask blank according to claim 14 wherein silicon and palladium contained in said sputtering target are in a relation represented by the following equation (III):

[atom % of palladium]/[(atom % of palladium)+(atom % of silicon)]×100=5 to 40(%)     Equation (III).

16. A method of manufacturing a halftone phase shift mask, comprising the steps of: subjecting the semitransparent film in the halftone phase shift mask blank according to claim 1 to an etching processing in dry etching using a chlorine containing gas and/or a fluorine containing gas.

17. A halftone phase shift mask wherein the halftone phase shift mask blank according to claim 1 is used, and a semitransparent mask pattern to be transferred to a wafer is formed on a transparent substrate.

18. The halftone phase shift mask according to claim 17 which is provided with a transmittance of 3% to 20% with respect to a desired exposure light in a wave range of 150 nm to 370 nm and which is subjected to an optical design to function as the phase shift mask.

19. A pattern transfer method, comprising the steps of: using the halftone phase shift mask according to claim 18 to perform a pattern transfer.

20. A semiconductor device which is formed by using the halftone phase shift mask according to claim 18 and performing a pattern transfer.

21. A pattern transfer method, comprising the steps of: using the halftone phase shift mask according to claim 17 to perform a pattern transfer.

22. A semiconductor device which is formed by using the halftone phase shift mask according to claim 17 and performing a pattern transfer.

23. A halftone phase shift mask blank for forming a phase shift mask, constituted by forming a semitransparent film which produces a predetermined amount of phase difference with respect to a light transmitted directly through a transparent substrate and attenuates light intensity on said transparent substrate, wherein said semitransparent film contains at least one element M selected from the group consisting of metals and transition metals (M denotes the metal or the transition metal other than palladium), silicon, palladium, and at least one selected from the group consisting of nitrogen, oxygen and hydrogen.

24. The halftone phase shift mask blank according to claim 23 wherein the total amount of silicon and palladium in said semitransparent film is in a range of 30 to 67 atom %.

25. The halftone phase shift mask blank according to claim 24, wherein said semitransparent film contains at least one element M selected from the group consisting of said metals and transition metals by more than 0 and not more than 20 atom %.

26. The halftone phase shift mask blank according to claim 23 wherein said semitransparent film contains at least one element M selected from the group consisting of said metals and transition metals by more than 0 and not more than 20 atom %.

27. The halftone phase shift mask blank according to claim 26 wherein silicon and palladium contained in said semitransparent film are in a relation represented by the following equation (II):

$$[\text{atom \% of palladium in the film}]/[(\text{atom \% of palladium in the film})+(\text{atom \% of silicon in the film})] \times 100 = 5 \text{ to } 40(\%) \quad \text{Equation (II)}.$$

28. The halftone phase shift mask blank according to claim 23 wherein at least one selected from the group consisting of nitrogen, oxygen and hydrogen contained in said semitransparent film forms a chemical bond to silicon.

29. The halftone phase shift mask blank according to claim 23 wherein at least one element M selected from the group consisting of said metals or transition metals comprises at least one element selected from the group consisting of cobalt, tantalum, tungsten, molybdenum, chromium, vanadium, titanium, niobium, zinc, zirconium, hafnium, germanium, aluminum, platinum, manganese, and iron.

30. The halftone phase shift mask blank according to claim 23 wherein said semitransparent film contains at least one element M selected from the group consisting of said metals and transition metals, silicon, palladium, and nitrogen.

31. The halftone phase shift mask blank according to claim 30 wherein the content of nitrogen in said semitransparent film is more than 0 and not more than 60 atom %.

32. The halftone phase shift mask blank according to claim 31 wherein the content of nitrogen in said semitransparent film is more than 0 and not more than 50 atom %.

33. The halftone phase shift mask blank according to claim 23 wherein said semitransparent film contains oxygen in a range of 0 to 65 atom %.

34. The halftone phase shift mask blank according to claim 33 wherein said semitransparent film contains oxygen in a range of 3 to 50 atom %.

\* \* \* \* \*